United States Patent
Lee et al.

(10) Patent No.: US 6,171,891 B1
(45) Date of Patent: Jan. 9, 2001

(54) METHOD OF MANUFACTURE OF CMOS DEVICE USING ADDITIONAL IMPLANT REGIONS TO ENHANCE ESD PERFORMANCE

(75) Inventors: Jian-Hsing Lee; Yi-Hsun Wu; Tiaw-Ren Shih, all of Hsin-Chu (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/031,653

(22) Filed: Feb. 27, 1998

(51) Int. Cl.[7] ............... H01L 21/336; H01L 21/8234
(52) U.S. Cl. ............... 438/197; 438/223; 438/224; 438/309; 438/358; 438/542
(58) Field of Search ................... 438/223, 224, 438/227, 230, 232, 233, 309, 357, 358, 369, 371, 523, 542, 621, 197

(56) References Cited

U.S. PATENT DOCUMENTS

| | | | |
|---|---|---|---|
| 4,851,257 | * 7/1989 | Young et al. | 438/618 |
| 5,130,760 | 7/1992 | Matzen et al. | 357/13 |
| 5,493,142 | 2/1996 | Randazzo et al. | 257/328 |
| 5,514,611 | 5/1996 | Kim et al. | 437/48 |
| 5,559,352 | 9/1996 | Hsu et al. | 257/328 |
| 5,663,082 | * 9/1997 | Lee | 438/234 |
| 5,677,224 | * 10/1997 | Kadosh et al. | 438/197 |
| 5,686,324 | * 11/1997 | Wang et al. | 438/231 |
| 5,933,721 | * 8/1999 | Hause et al. | 438/217 |
| 5,952,701 | * 9/1999 | Bulucea et al. | 257/407 |

* cited by examiner

Primary Examiner—Carl Whitehead, Jr.
Assistant Examiner—Maria Guerrero
(74) Attorney, Agent, or Firm—George O. Saile; Stephen B. Ackerman; Graham J. Jones II (57) ABSTRACT

A method of forming a semiconductor memory device formed on a semiconductor substrate with an N-well and a P-well comprises the following steps. Form over a substrate the combination of a gate oxide layer and a gate layer patterned into gate stacks with sidewalls for an NMOS FET device over a P-well in the substrate and a PMOS FET device over an N-well. Form P− lightly doped S/D regions in the N-well and N− lightly doped S/D regions in the P-well. Form spacers on the sidewalls of the gate stacks. Thereafter form deep N− lightly doped S/D regions in the P-well, and form deep P− lightly doped S/D regions in the N-well. Form heavily doped P++ regions self-aligned with the gate below future P+ S/D sites to be formed self-aligned with the spacers in the N-well, and form heavily doped N++ regions self-aligned with the gate below future N+ S/D sites to be formed self-aligned with the spacers in the P-well.

7 Claims, 8 Drawing Sheets

METHOD OF MANUFACTURE OF CMOS DEVICE USING ADDITIONAL IMPLANT REGIONS TO ENHANCE ESD PERFORMANCE

BACKGROUND OF THE INVENTION

1. Field of the Invention

This invention relates to semiconductor memory devices and more particularly to CMOS devices with enhanced ESD performance.

2. Description of Related Art

Junction leakage and junction short circuits to the substrate are more and more likely to occur in advanced technology devices as the dimensions of the devices forming those circuits become smaller and smaller.

U.S. Pat. No. 5,514,611 of Kim et al. for "Method for Manufacturing a Semiconductor Memory Device Having a Read-Only Memory Cell" shows a S/D (source/drain) structure with three I/I (Ion Implanted) doped regions.

U.S. Pat. No. 5,559,352 of Hsue for "ESD Protection Improvement" shows an ESD circuit with three I/I doped regions.

U.S. Pat. No. 5,493,142 of Randazzo et al. for "Input/Output Transistors with Optimized ESD Protection" has a lightly doped region disposed near the gate and the surface of the substrate. A sidewall oxide layer is selectively etched to extend laterally from a gate by a significant amount. The sidewall oxide layer is also etched on an opposite side of the gate and may extend laterally an appreciable amount in that direction. Heavily doped S/D regions are implanted in the substrate. The extent of the sidewall oxide, and thus the lightly doped regions separating the gate from the drain and source, can be tailored to optimize ESD protection and performance characteristics for a given application by defocusing snapback conduction.

U.S. Pat. No. 5,130,760 of Matzen et al. for "Bidirectional Surge Suppressor Zener Diode Circuit With Guard Ring" describes a semiconductor device incorporating doped regions of a substrate and epitaxial layers which result in a dual Zener diode arrangement having the Zener diodes associated in an opposite polarity arrangement.

SUMMARY OF THE INVENTION

A method of forming a semiconductor memory device formed on a semiconductor substrate with an N-well and a P-well comprises the following steps. Form over a substrate the combination of a gate oxide layer and a gate electrode layer patterned into gate electrode stacks with sidewalls for an NMOS FET device over a P-well in the substrate and a PMOS FET device over an N-well. Form P− lightly doped source/drain regions in the N-well. Form N− lightly doped source/drain regions in the P-well. Form spacers on the sidewalls of the gate electrode stacks. Thereafter form deep N− lightly doped source/drain regions in the P-well, and form deep P− lightly doped source/drain regions in the N-well. Form heavily doped P++ regions self-aligned with the gate electrode below future P+ source/drain sites to be formed self-aligned with the spacers in the N-well, and form heavily doped N++ regions self-aligned with the gate electrode below future N+ source/drain sites to be formed self-aligned with the spacers in the P-well.

Form the N+ type source/drain regions in the P-well in the source/drain sites. Form the P+ type source/drain regions in the N-well in the source/drain sites. Form refractory metal silicide layers over the gate electrode layers.

Form refractory metal silicide layers over the source/drain regions, form P−/N++ junctions below the N+ source/drain regions in the P-well, and form N−/P++ junctions below the P+ source/drain regions in the N-well.

The deep lightly doped N− and P− regions are formed to a depth from about 0.2 μm to about 0.3 μm below the surface of the substrate, and the counterdoped N++ and P++ regions are formed to a depth from about 0.1 μm to about 0.2 μm below the surface of the substrate.

Preferably, the deep lightly doped N− and P− regions are formed to a depth from about 0.2 μm to about 0.3 μm below the surface of the substrate, with a concentration of phosphorus, $p^{31}$, dopant in the N− regions from about 1 E 17 atoms/cm$^3$ to about 1 E 18 atoms/cm$^3$.

There is a concentration of boron, B, dopant in the P− regions from about 1 E 17 atoms/cm$^3$ to about 1 E 18 atoms/cm$^3$ The counterdoped N++ and P++ regions are formed to a depth from about 0.1 μm to about 0.2 μm below the surface of the substrate.

There is a concentration of phosphorus, $p^{31}$, or arsenic, As, dopant in the N++ regions from about 5 E 20 atoms/cm$^3$ to about 1 E 21 atoms/cm$^3$ and a concentration of boron, B, dopant in the P++ regions from about 5 E 20 atoms/cm$^3$ to about 1 E 21 atoms/cm$^3$.

The S/D regions are formed with a concentration of arsenic, As, dopant in the N+ regions from about 1 E 20 atoms/cm$^3$ to about 5 E 20 atoms/cm$^3$ and a concentration of boron, B, dopant in the P+ regions from about 1 E 20 atoms/cm$^3$ to about 5 E 20 atoms/cm$^3$.

The lightly doped S/D regions are formed with a concentration of phosphorus, $p^{31}$, or arsenic, As, dopant in the N− regions from about 1 E 18 atoms/cm$^3$ to about 1 E 20 atoms/cm$^3$ and a concentration of boron, B, dopant in the P− regions from about 1 E 18 atoms/cm$^3$ to about 1 E 20 atoms/cm$^3$.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
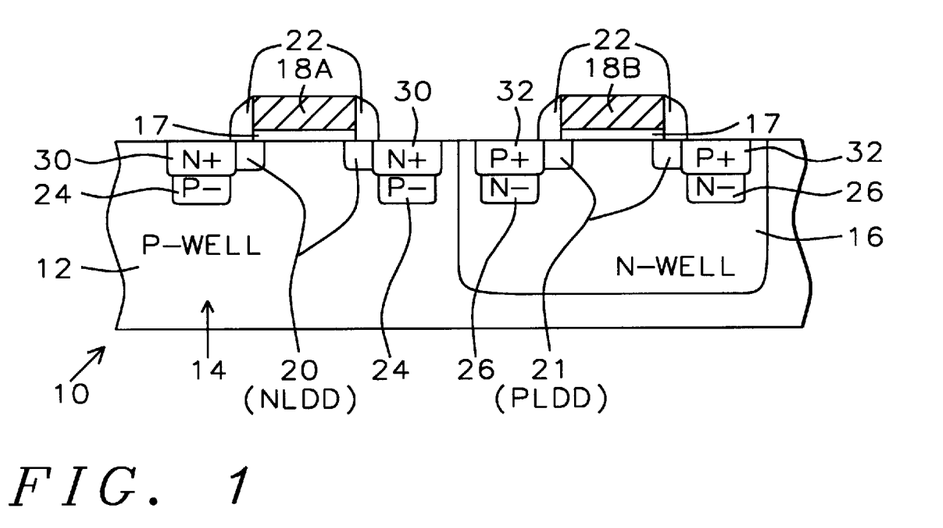
FIG. 1 shows a CMOS FET device with a P− doped substrate in which a P-well and an N-well are formed.
Figure 4:
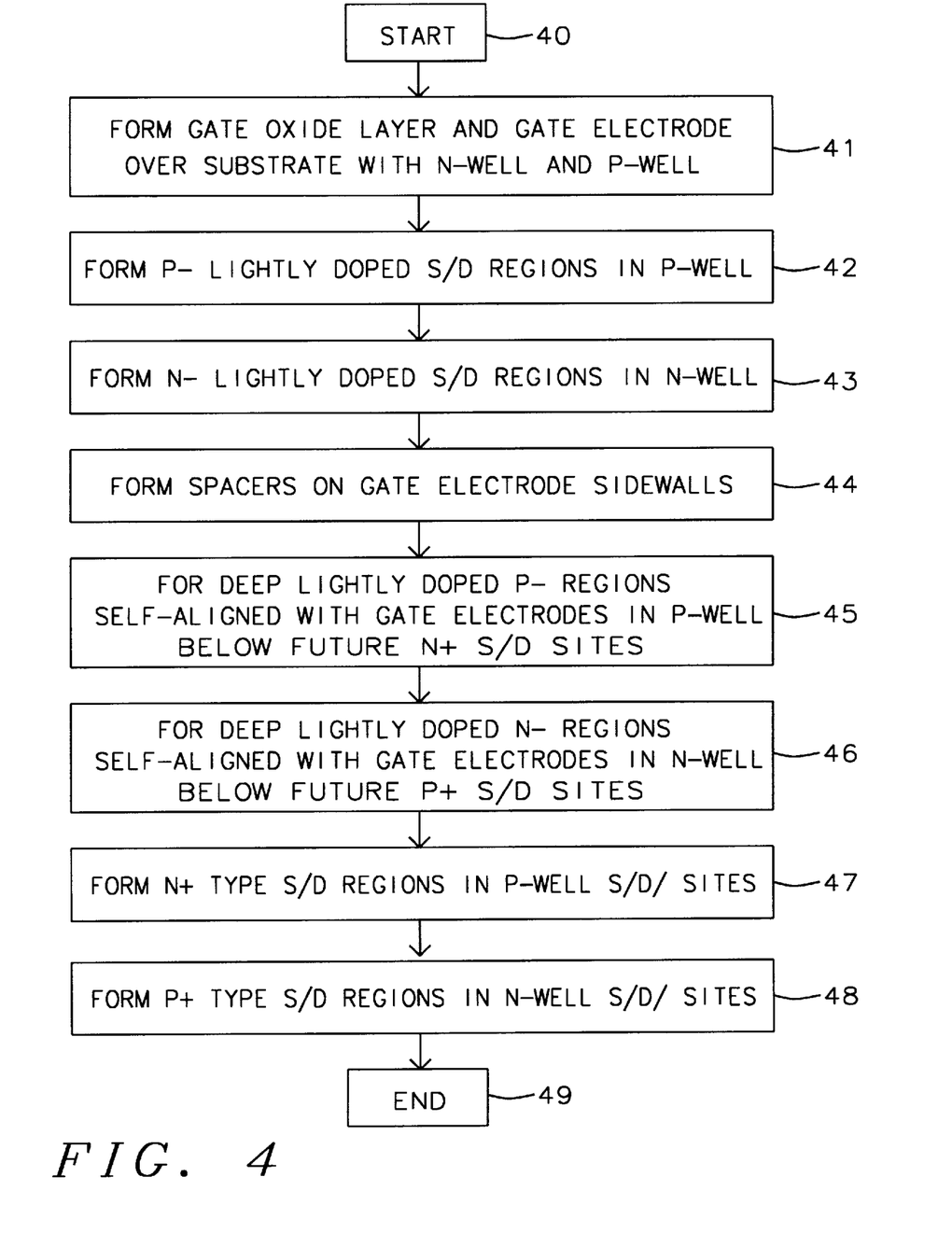
FIG. 4 shows the steps of the process for forming the device of FIG. 1.

FIG. 1 shows a CMOS FET device 10 with P− doped substrate 12 in which a P-well 14 and an N-well 16 are formed. In FIG. 4, the steps of the process for forming the device 10 of FIG. 1 are described. The process starts in step 40 with P− doped silicon semiconductor substrate 12.

In step 41, a gate oxide layer 17 is formed on substrate 12 and layer 17 is covered with a doped polysilicon layer, which has been patterned along with gate oxide layer 17 into gate electrodes 18A and 18B.

In step 42, form a mask (not shown) and form PLDD (P-doped LDD) Lightly Doped Drain and source regions 21 in N-well 16 self-aligned with the gate electrode 18B.

In step 43, form a mask (not shown) and form NLDD (N-doped LDD) Lightly Doped Drain and source regions 20 in the P-well 14 self-aligned with the gate electrode 18A.

In step 44, form spacers 22 on sidewalls of gate electrodes 18A and 18B.

In step 45, form deep lightly doped N− regions 26 in N-well 16, self-aligned with gate electrode 18B. Lightly doped N− regions 26 are far below the P+ S/D sites 32 which are to be formed in the future.

In step 46, form deep lightly doped P− regions 24 in P-well 14, self-aligned with gate electrode 18A. Lightly doped P− regions 24 are far below the N+ S/D sites 30 which are to be formed in the future.

In step 47, form N+ type S/D regions 30 in P-well 14 self-aligned with gate electrode 18A.

In step 48, form P+ type S/D regions 32 in N-well 16 self-aligned with gate electrode 18B.

In step 49, END the process of FIGS. 1 and 4.

Figure 2:
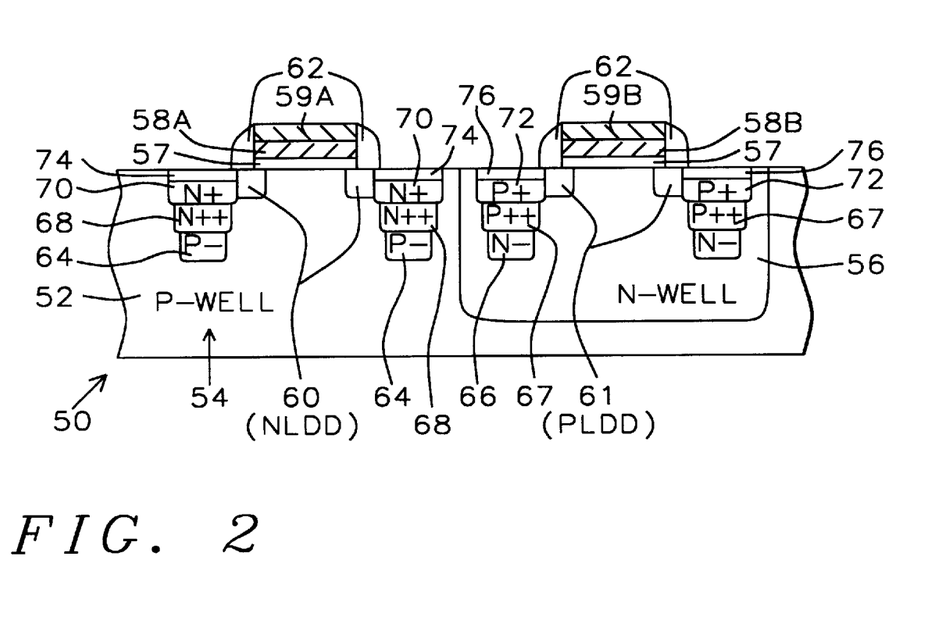
FIG. 2 shows an alternative CMOS FET device with P− doped substrate in which a P-well and an N-well are formed.
Figure 5A:
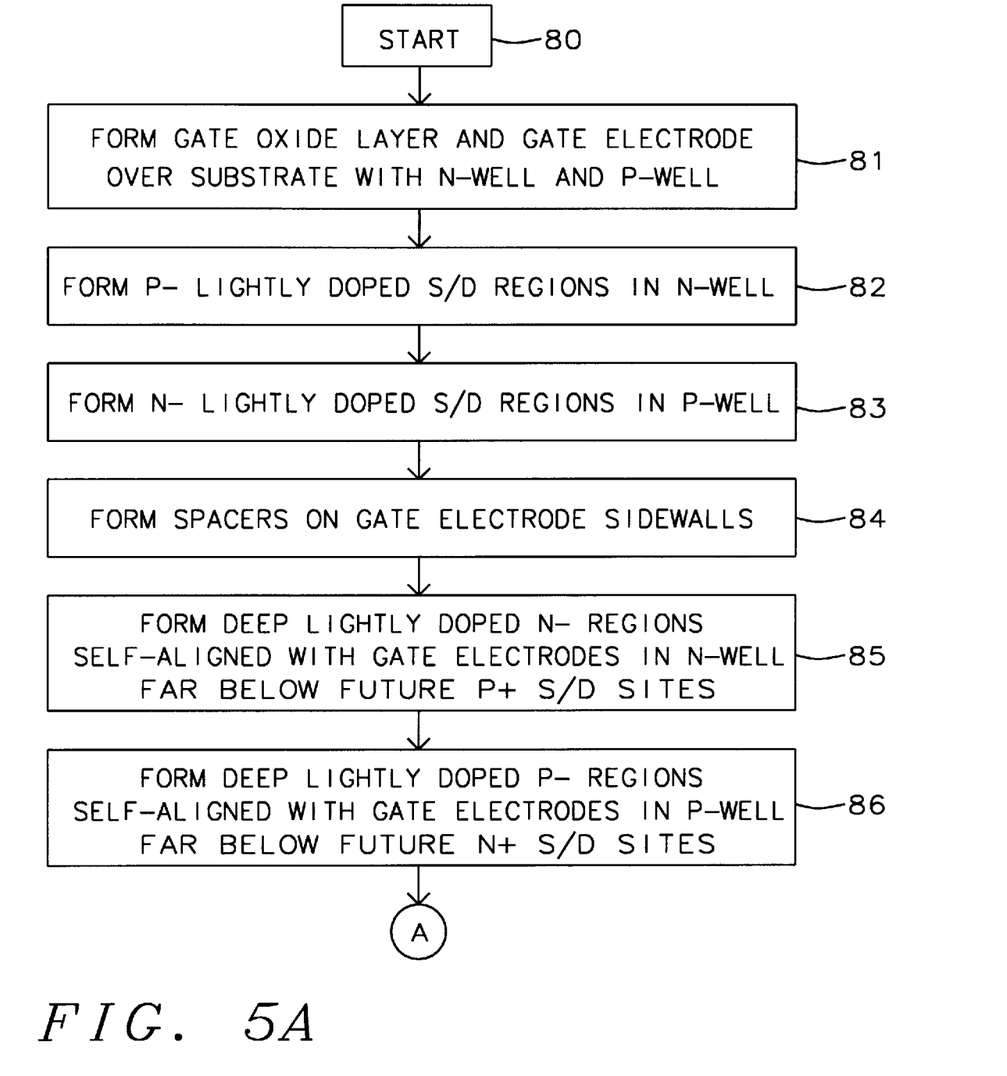
FIGS. 5A and 5B show the steps of the process for forming the devices of FIGS. 2 and 3.
Figure 5B:
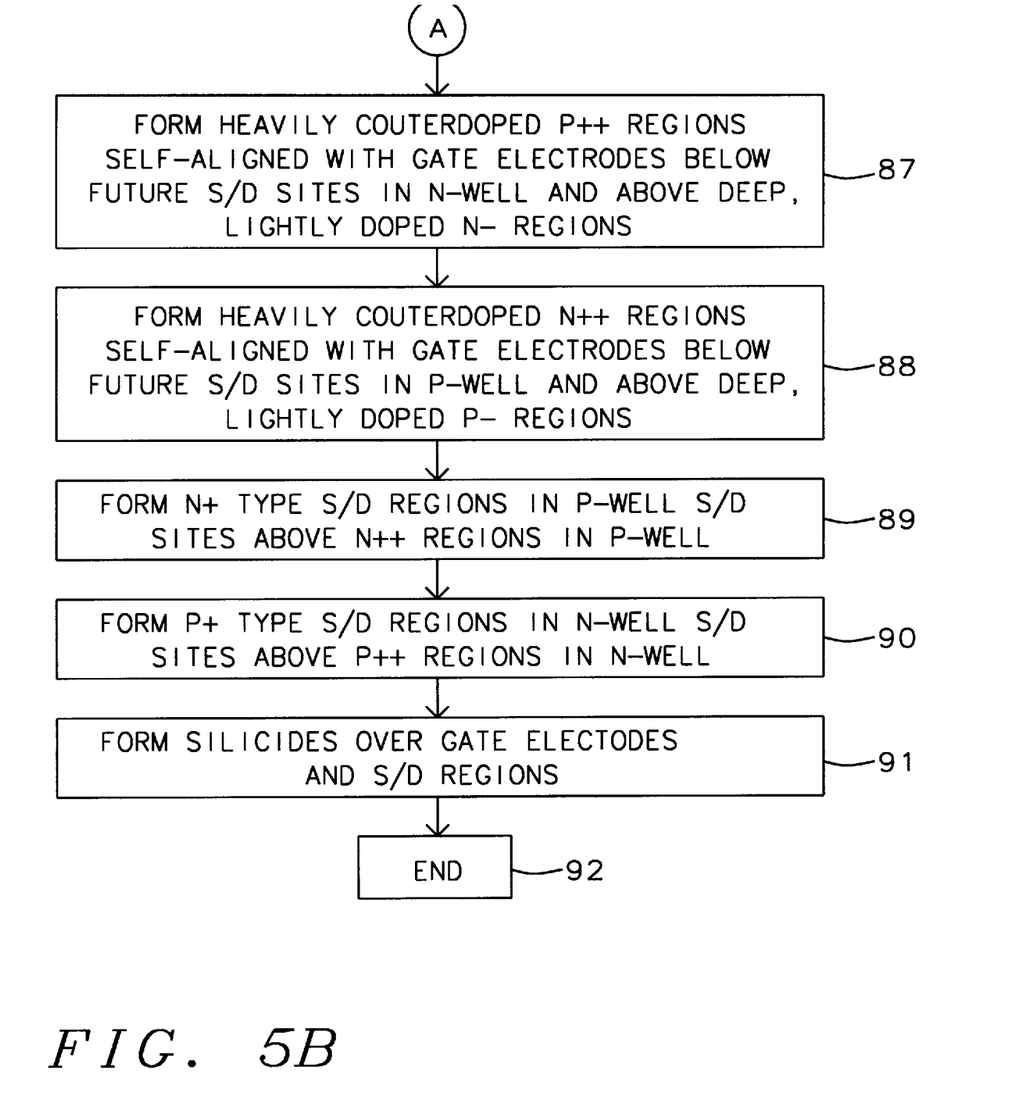

FIG. 2 shows a CMOS FET device 50 with P− doped substrate 53 in which a P-well and an N-well 16 are formed. In FIGS. 5A and 5B, the steps of the process for forming the device 50 of FIG. 2 are described. The process starts in step 80 with a P− doped silicon semiconductor substrate 52.

In step 81, a gate oxide layer 57 is formed on substrate 53 which contains an N-well 56 and a P-well 54. The gate oxide layer 57 is covered with a doped polysilicon layer which has been patterned along with gate oxide layer 57 into doped polysilicon gate electrodes 58A and 58B in a pair of gate electrode stacks over substrate 52.

In step 82, form a mask (not shown) and form PLDD, Lightly Doped Drain, and source regions 61 in N-well 56 self-aligned with the gate electrode 58B.

The PLDD regions 61 were ion implanted with a dose of $BF_2$ dopant from about 1 E 13 ions/cm$^2$ to about 5 E 14 ions/cm$^2$ at an energy from about 5 keV to about 30 keV. After annealing the concentration of boron, B, dopant in the regions 61 was from about 1 E 18 atoms/cm$^3$ to about 1 E 20 atoms/cm$^3$.

In step 83, form an NLDD mask (not shown) and form LDD source and drain regions 60 in the P-well 14 self-aligned with the gate electrode 58A.

The NLDD regions 60 were ion implanted with a dose of phosphorus, $p^{31}$, or arsenic, As, dopant from about 1 E 13 ions/cm$^2$ to about 3 E 14 ions/cm$^2$ at an energy from about 10 keV to about 40 keV. After annealing the concentration of phosphorus, P, or arsenic, As, dopant in the NLDD regions 60 was from about 1 E 18 atoms/cm$^3$ to about 1 E 20 atoms/cm$^3$.

In step 84, form spacers 62 on sidewalls of gate electrodes 58A and 58B.

In step 85, form deep lightly doped N− regions 66 in N-well 56, self-aligned with gate electrode 18B. Lightly doped N− regions 66 are far below the P+ S/D sites 72 which are to be formed in the future.

The deep lightly doped N− regions 66 were ion implanted with a dose of phosphorus, $p^{31}$ dopant from about 1 E 12 ions/cm$^2$ to about 1 E 13 ions/cm$^2$ at an energy from about 50 kev to about 100 keV. After annealing the concentration of $p^{31}$ dopant in the regions 66 was from about 1 E 17 atoms/cm$^3$ to about 1 E 18 atoms/cm$^3$.

In step 86, form deep lightly doped P− regions 64 in P-well 54, self-aligned with gate electrode 58A. Lightly doped P− regions 64 are far below the N+ S/D sites 70 which are to be formed in the future.

The deep lightly doped P− regions 64 were ion implanted with a dose of boron difluoride, $BF_2$ dopant from about 1 E 12 ions/cm$^2$ to about 1 E 13 ions/cm$^2$ at an energy from about 35 keV to about 70 keV. After annealing the concentration of boron, B, dopant in the regions 64 was from about 1 E 17 atoms/cm$^3$ to about 1 E 18 atoms/cm$^3$.

The deep lightly doped N− and P− regions are formed to a depth from about 2000 Å (0.2 $\mu$m) to about 3,000 Å (0.3 $\mu$m) below the surface of the substrate 52.

In step 87 form heavily counterdoped P++ regions 67 self-aligned with gate electrodes below future S/D sites 72 in N-well 56 and above deep, lightly doped N− regions 66.

The P++ regions 67 were ion implanted with $BF_2$ dopant dose from about 5 ions/cm$^2$ to about 1 E 16 ions/cm$^2$. After annealing the concentration of boron, B, dopant in the regions 70 was from about 5 E 20 atoms/cm$^3$ to about 1 E 21 atoms/cm$^3$.

In step 88 form heavily counterdoped N++ regions 68 self-aligned with gate electrodes below future S/D sites 70 in P-well 54 and above deep, lightly doped P− regions 64.

The N++ regions 68 were ion implanted with a dose of arsenic, As, dopant from about 5 E 15 ions/cm$^2$ to about 1 E 16 ions/cm$^2$ at from about 50 keV to about 100 keV energy. After annealing the concentration of P or As dopant in the regions 68 was from about 5 E 20 atoms/cm$^3$ to about 1 E 21 atoms/cm$^3$. The counterdoped N++ and P++ regions are formed to a depth from about 1,000 Å to (0.1 $\mu$m) to about 2000 Å (0.2 $\mu$m) below the surface of the substrate 52.

In step 89, form N+ type S/D regions 70 in P-well 54 above heavily counterdoped N++ regions 68 self-aligned with gate electrode 58A.

The N+ regions 70 were ion implanted with a dose of arsenic dopant from about 1 E 15 ions/cm$^2$ to about 5 E 15 ions/cm$^2$ at an energy from about 25 keV to about 50 keV. After annealing, the concentration of arsenic, As, dopant in the regions 70 was from about 1 E 20 atoms/cm$^3$ to about 5 E 20 atoms/cm$^3$.

In step 90, form P+ type S/D regions 72 in N-well 56 above heavily counterdoped P++ regions 67 self-aligned with gate electrode 58B.

The P+ regions 72 were ion implanted with a dose of $BF_2$ dopant from about 1 E 15 ions/cm$^2$ to about 5 E 15 ions/cm$^2$ at an energy from about 20 keV to about 40 keV. After annealing, the concentration of boron, B, dopant in the regions 72 was from about 1 E 20 atoms/cm$^3$ to about 5 E 20 atoms/cm$^3$.

In step 91, form tungsten silicide layers 59A/59B over the gate electrode 58A/58B and titanium silicide layers 74/76 over the source/drain regions 74/76. The tungsten silicide layers 59A/59B are formed by the process of reaction between $WF_6$ and $Si_2H_2$. The silicides are selected from the group consisting of silicides of tungsten, cobalt, hafnium, molybdenum, nickel, palladium, platinum, tantalum, titanium, and zirconium.

In step 92, END the process of FIGS. 2, 5A and 5B.

Figure 3:
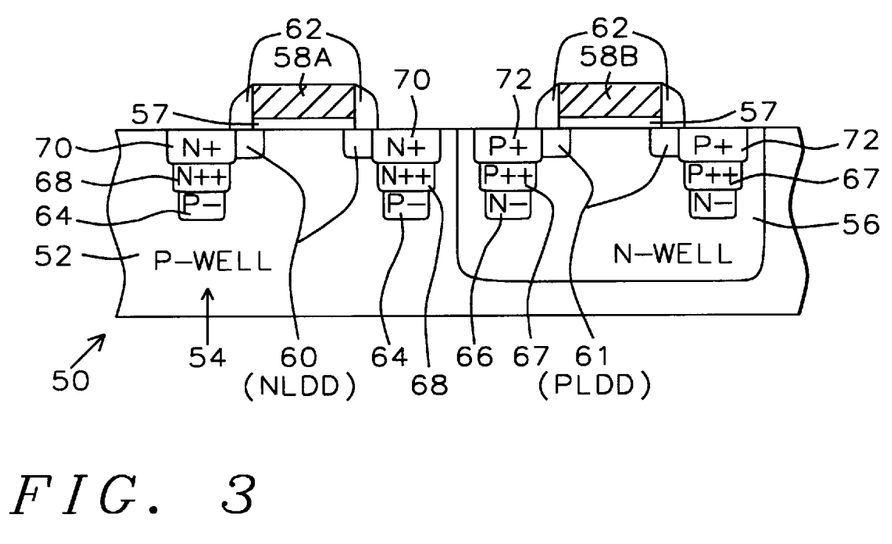
FIG. 3 shows the CMOS FET device of FIG. 2 with P− doped substrate in which a P-well and an N-well are formed, but without the silicide layers of FIG. 2

FIG. 3 shows the CMOS FET device 50 of FIG. 2 with P-doped substrate 53 in which a P-well and an N-well 16 are formed, but without the silicide layers 59A, 59B, 74 and 76. The process is the same as that of FIGS. 5A and 5B except that the step 91 is omitted.

Figure 6A:
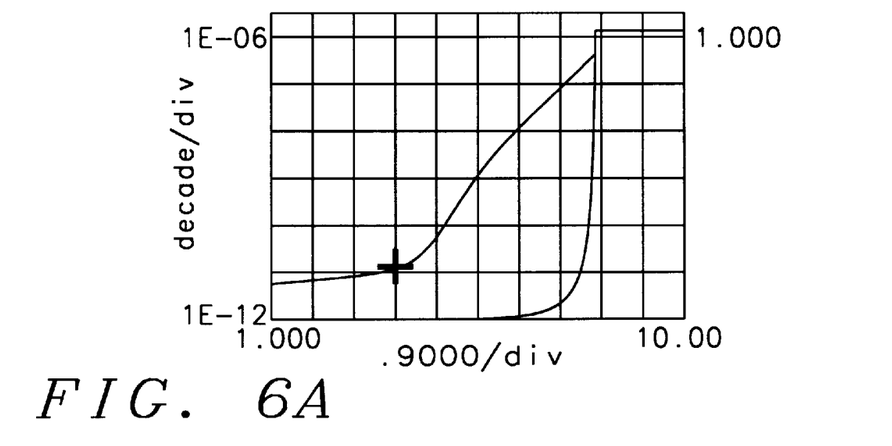
FIGS. 6A–6D show graphs for the silicide arrangement of FIG. 2 with no boron, B, ESD implant, a boron, B, ESD implant (B0), a boron, B, ESD implant (B1), or a boron, B, ESD implant (B2).

FIG. 6A shows a graph for the silicide arrangement of FIG. 2 with no boron, B, ESD implant.

Figure 6B:
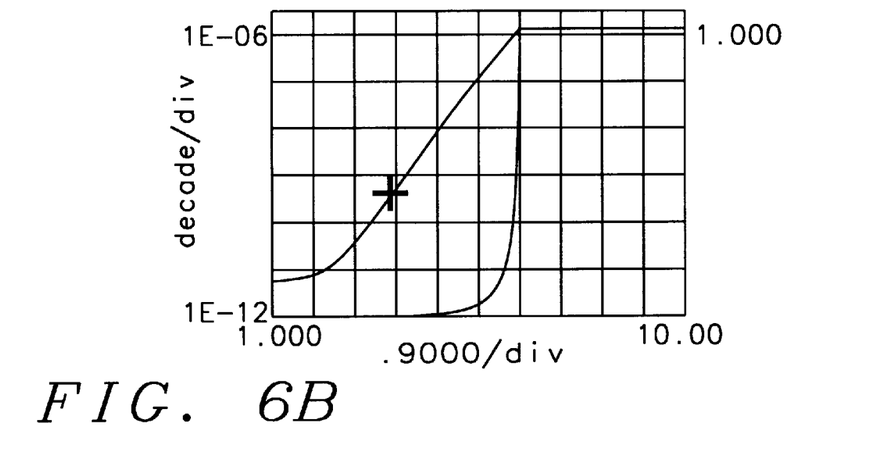

FIG. 6B shows a graph for the silicide arrangement of FIG. 2 with a boron, B, ESD implant (B0).

Figure 6C:
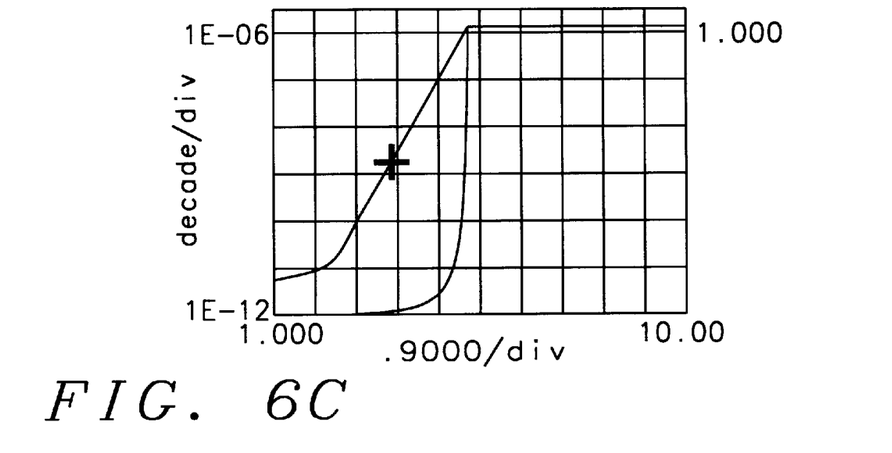

FIG. 6C shows a graph for the silicide arrangement of FIG. 2 with a boron, B, ESD implant (B1).

Figure 6D:
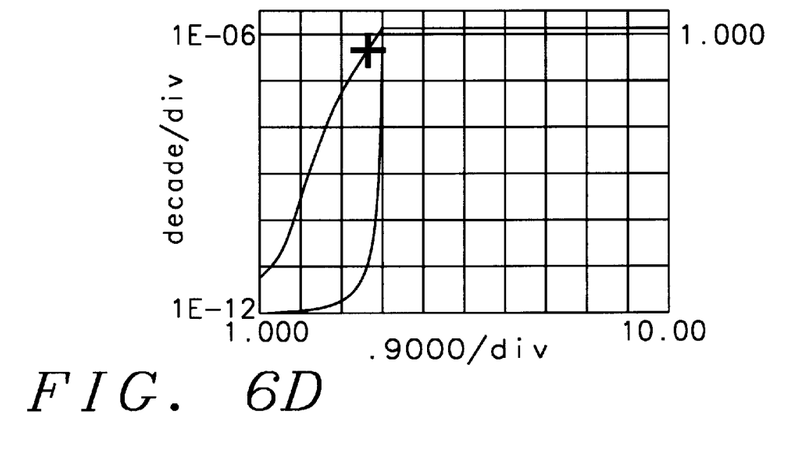

FIG. 6D shows a graph for the silicide arrangement of FIG. 2 with a boron, B, ESD implant (B2).

Figure 7A:
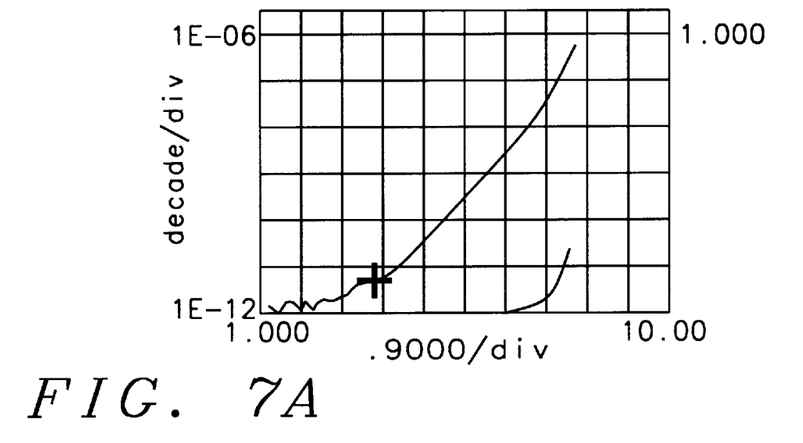
FIGS. 7A–7D show graphs for a polycide arrangement of FIG. 2 with no boron, B, ESD implant or with a boron, B, ESD implant (B0), a boron, B, ESD implant (B1), or a boron, B, ESD implant (B2).

FIG. 7A shows a graph for a polycide arrangement of FIG. 2 with no boron, B, ESD implant.

Figure 7B:
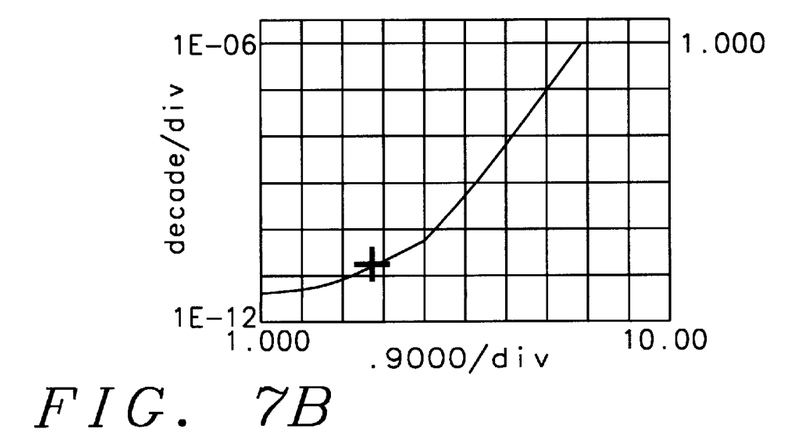

FIG. 7B shows a graph for a polycide arrangement of FIG. 2 with a boron, B, ESD implant (B0).

Figure 7C:
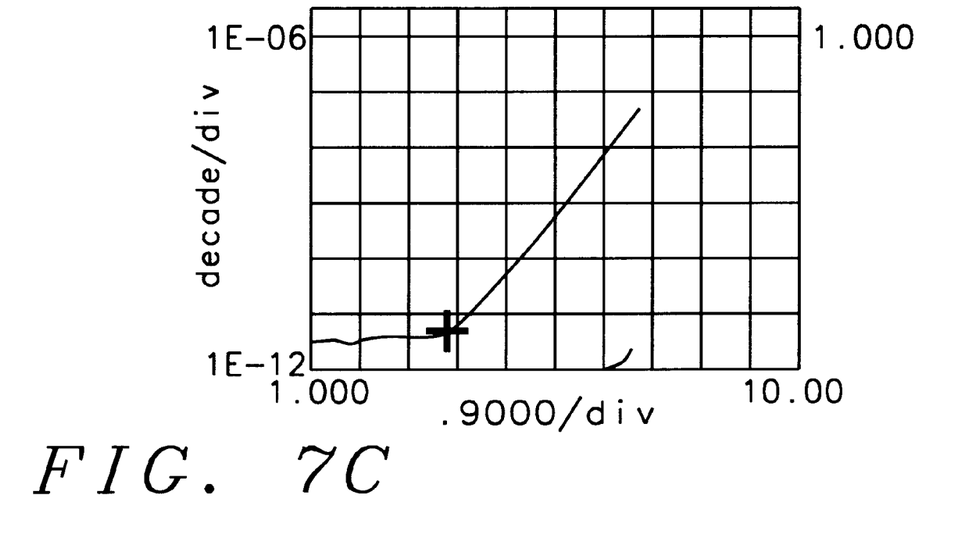

FIG. 7C shows a graph for a polycide arrangement of FIG. 2 with a boron, B, ESD implant (B1).

Figure 7D:
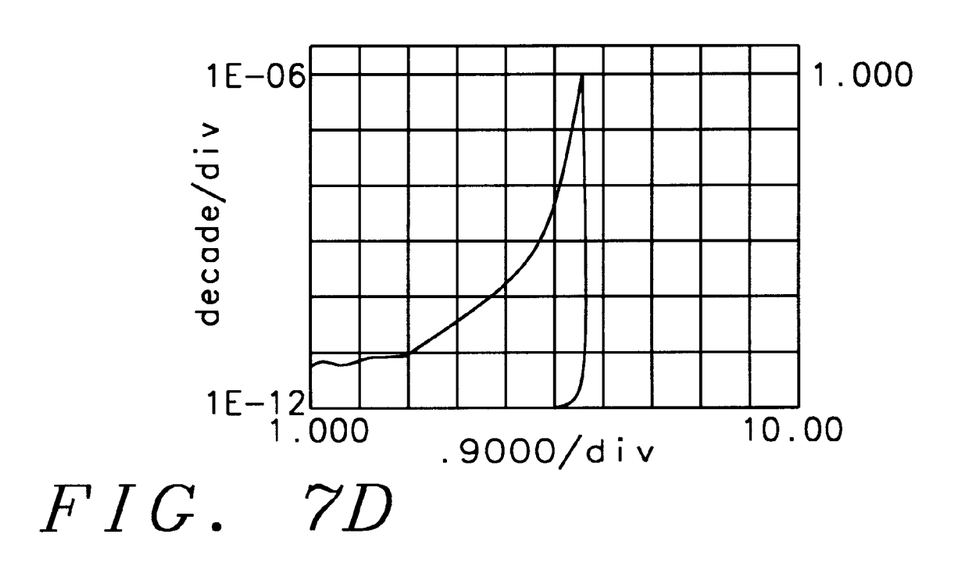

FIG. 7D shows a graph for a polycide arrangement of FIG. 2 with a boron, B, ESD implant (B2).

Summary of Features Shown in FIGS. 2 and 3
For NMOS
1. Add a N-type implant to the bottom of the drain/source regions.
2. Add a P-type implant to the bottom of the N-type implantation.
For PMOS
1. Add a P-type implant to the bottom of the drain/source
2. Add a N-type implant to the bottom of the P-type implantation.

This avoids the NMOS drain/source N+ junction might be overwhelmed by the P− implant and causes the junction spike to the substrate. Similarly it avoids overwhelming the PMOS drain/source P+ junction by the N− implant and causes the junction spike to the N-well. This reduces the breakdown voltage to enhance the ESD performance. The effective bipolar area is increased.

While this invention has been described in terms of the above specific embodiments, those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a semiconductor memory device on a semiconductor substrate within which are formed an N-well and a P-well within which source/drain sites are formed comprising the steps as follows:

forming a gate oxide layer and a gate electrode layer patterned into a gate electrode stack with sidewalls over the semiconductor substrate with an N-well and a P-well, forming P− lightly doped source/drain regions in the N-well, forming N− lightly doped source/drain regions in the P-well, forming spacers on the gate electrode sidewalls, forming N++ type regions below respective source/drain sites and forming P++ type regions below respective source/drain sites, forming the N+ type source/drain regions in the P-well in the source/drain sites above the N++ type regions, forming the P+ type source/drain regions in the N-well in the source/drain sites above the P++ type regions, and forming additional, deep, lightly doped N− regions in the N-well self-aligned with the spacers below the P++ type regions, and forming additional, deep, lightly doped P− regions in the N-well self-aligned with the spacers below the N++ type regions.

2. The method of claim 1 including forming P−/N++ junctions below the N+ source/drain regions in the P-well and forming N−/P++ junctions below the P+ source/drain regions in the N-well from the heavily doped N++/P++ regions and the additional, deep, lightly doped N− and P-regions.

3. A method of forming a semiconductor memory device formed on a semiconductor substrate covered with a gate oxide layer upon which are formed gate electrode stacks, with an N-well formed in the semiconductor substrate with P− lightly doped source/drain regions formed self-aligned with gate electrode stacks, with P+ source/drain sites, with heavily doped P++ regions below the P+ source/drain sites, and additional, deep, lightly doped N− regions located deep below the heavily doped P++ regions and a P-well formed in the semiconductor substrate with N− lightly doped source/drain regions formed self-aligned with gate electrode stacks, with N+ source/drain sites, with heavily doped N++ regions below the N+ source/drain sites, and additional, deep, lightly doped P− regions located deep below the heavily doped N++ regions comprising the steps as follows:

forming over the semiconductor substrate a combination of a gate oxide layer and a gate electrode layer patterned into gate electrode stacks with sidewalls for an NMOS FET device over a P-well in the semiconductor substrate and a PMOS FET device over an N-well, forming P− lightly doped source/drain regions in the N-well self-aligned with the gate electrode stacks therein, and forming N− lightly doped source/drain regions in the P-well self-aligned with the gate electrode stacks therein, forming spacers on the sidewalls of the gate electrode stacks, thereafter forming the additional, deep, lightly doped N-regions in the P-well, and forming the additional, deep, lightly doped P− regions in the N-well, forming heavily doped P++ regions self-aligned with the gate electrode below P+ source/drain sites self-aligned with the spacers in the N-well, and forming heavily doped N++ regions self-aligned with the gate electrode below future N+ source/drain sites to be formed self-aligned with the spacers in the P-well, forming the N+ type source/drain regions in the P-well in the source/ drain sites, forming the P+ type source/drain regions in the N-well in the source/drain sites, and forming P−/N++ junctions below the N+ source/drain regions in the P-well and forming N−/P++ junctions below the P+ source/drain regions in the N-well from the heavily doped N++/P++ regions and the additional, deep, lightly doped N− regions and the additional, deep, lightly doped P-regions.

4. A method of forming a semiconductor memory device formed on a semiconductor substrate with a gate oxide layer upon which are formed gate electrode stacks, an N-well formed in the semiconductor substrate with P– lightly doped source/drain regions formed self-aligned with gate electrode stacks, with P+ source/drain sites, with heavily doped P++ regions below the P+ source/drain sites, and additional, deep, lightly doped N– doped regions located deep below the heavily doped P++ regions and a P-well formed in the semiconductor substrate with N– lightly doped source/drain regions formed self-aligned with gate electrode stacks, with N+ source/drain sites, with heavily doped N++ regions below the N+ source/drain sites, and additional deep, lightly doped P– regions located deep below the heavily doped N++ regions, comprising the steps as follows:

forming over the semiconductor substrate a combination of the gate oxide layer and a gate electrode layer patterned into the gate electrode stacks with sidewalls for an NMOS FET device over a P-well in the semiconductor substrate and a PMOS FET device over an N-well, forming P– lightly doped source/drain regions self-aligned with the gate electrode stacks in the N-well, forming N– lightly doped source/drain regions self-aligned with the gate electrode stacks in the P-well, forming spacers on the sidewalls of the gate electrode stacks, thereafter forming the additional, deep, lightly doped N– regions in the P-well, and forming the additional, deep, lightly doped P– regions in the N-well, forming heavily doped P++ regions below the P+ source/drain sites self-aligned with the spacers in the N-well, and forming heavily doped N++ regions below the N+ source/drain sites self-aligned with the spacers in the P-well, forming the N+ type source/drain regions in the P-well in the source/drain sites, forming the P+ type source/drain regions in the N-well in the source/drain sites, forming refractory metal silicide layers over the gate electrode layers, and forming P–/N++ junctions below the N+ source/drain regions in the P-well and forming N–/P++ junctions below the P+ source/drain regions in the N-well from the heavily doped N++/P++ regions and the additional, deep, lightly doped N– regions and the additional, deep, lightly doped P– regions.

5. The method of claim 4 including forming refractory metal silicide layers over the source/drain regions.

6. A method of forming a semiconductor memory device formed on a semiconductor substrate with a sate oxide layer upon which are formed gate electrode stacks, an N-well formed in the semiconductor substrate with P– lightly doped source/drain regions formed self-aligned with gate electrode stacks, with P+ source/drain sites, with heavily doped P++ regions below the P+ source/drain sites, and additional, deep, lightly doped N– regions located deep below the heavily doped P++ regions and a P-well formed in the semiconductor substrate with N– lightly doped source/drain regions formed self-aligned with gate electrode stacks, with N+source/drain sites, with heavily doped N++ regions below the N+source/drain sites, and additional, deep, lightly doped P– regions located deep below the heavily doped N++ regions, comprising the steps as follows:

forming over the semiconductor substrate a combination of the gate oxide layer and a gate electrode layer patterned into the gate electrode stacks with sidewalls for an NMOS FET device over a P-well in the semiconductor substrate and a PMOS FET device over an N-well, forming P– lightly doped source/drain regions self-aligned with the gate electrode stacks in the N-well, forming N– lightly doped source/drain regions self-aligned with the gate electrode stacks in the P-well, forming spacers on the sidewalls of the gate electrode stacks, thereafter forming the additional, deep, lightly doped N– regions in the P-well, and forming the additional, deep, lightly doped P– regions in the N-well, forming heavily doped P++ regions below the P+ source/drain sites self-aligned with the spacers in the N-well, and forming heavily doped N++ regions below the N+ source/drain sites self-aligned with the spacers in the P-well, forming the N+ type source/drain regions in the P-well in the source/drain sites, forming the P+ type source/drain regions in the N-well in the source/drain sites, forming refractory metal silicide layers over the gate electrode layers, with the additional, deep, lightly doped N– and P– regions being formed to a depth from about 2000 Å to about 3,000 Å below the surface of the semiconductor substrate, and with the N++ and P++ regions being formed to a depth from about 1,000 Å to about 2000 Å below the surface of the semiconductor substrate.

7. A method of forming a semiconductor memory device formed on a semiconductor substrate with a gate oxide layer upon which are formed gate electrode stacks, an N-well formed in the semiconductor substrate with P– lightly doped source/drain regions formed self-aligned with gate electrode stacks, with P+ source/drain sites, with heavily doped P++ regions below the P+ source/drain sites, and additional, deep, lightly doped N– regions located deep below the heavily doped P++ regions and a P-well formed in the semiconductor substrate with N– lightly doped regions formed self-aligned with gate electrode stacks, with N+ source/drain sites, with heavily doped N++ regions below the N+ source/drain sites, and additional, deep, lightly doped P– regions located deep below the heavily doped N++ regions, comprising the steps as follows:

forming over the semiconductor substrate a combination of the gate oxide layer and a gate electrode layer patterned into the gate electrode stacks with sidewalls for an NMOS FET device over a P-well in the semiconductor substrate and a PMOS FET device over an N-well, forming P– lightly doped source/drain regions self-aligned with the gate electrode stacks in the N-well, forming N– lightly doped source/drain regions self-aligned with the gate electrode stacks in the P-well, forming spacers on the sidewalls of the gate electrode stacks, thereafter forming the additional, deep, lightly doped N– regions in the P-well and forming the additional, deep, lightly doped P-regions in the N-well, forming heavily doped P++ regions below the P+ source/drain sites self-aligned with the spacers in the N-well, and forming heavily doped N++ regions below the N+ source /drain sites self-aligned with the spacers in the P-well, forming the N+ type source/drain regions in the P-well in the source/drain sites, forming the P+ type source/drain regions in the N-well in the source /drain sites, forming refractory metal silicide layers over the gate electrode layers, as follows:
   forming refractory metal silicide layers over the source/drain regions,
   forming P−/N++ junctions below the N+ source/drain regions in the P-well and forming N−/P++ junctions below the P+ source/drain regions in the N-well from the heavily doped N++/P++ regions and the additional, deep, lightly doped N− regions and the additional deep, lightly doped P-regions, with the deep lightly doped N− and P− regions formed to a depth from about 2000 Å to about 3,000 Å below the surface of the semiconductor substrate, and with the N++ and P++ regions formed to a depth from about 1,000 Å to about 2,000 Å below the surface of the semiconductor substrate.

* * * * *

UNITED STATES PATENT AND TRADEMARK OFFICE
CERTIFICATE OF CORRECTION

PATENT NO. : 6,171,891
DATED : January 9, 2001
INVENTOR(S) : Jian-Hsing Lee et al.

It is certified that error appears in the above-identified patent and that said Letters Patent is hereby corrected as shown below:

Title page, Item [73], please change "Tiaw-Ren Shih" to read -- Jiaw-Ren Shih--.

Signed and Sealed this

Fifteenth Day of May, 2001

*Attest:*

NICHOLAS P. GODICI

*Attesting Officer*      Acting Director of the United States Patent and Trademark Office